(12) United States Patent
Shinohara

(10) Patent No.: US 11,894,172 B2
(45) Date of Patent: Feb. 6, 2024

(54) DOMAIN WALL MOVING ELEMENT, DOMAIN WALL MOVING TYPE MAGNETIC RECORDING ELEMENT AND MAGNETIC RECORDING ARRAY

(71) Applicant: TDK CORPORATION, Tokyo (JP)

(72) Inventor: Tetsuhito Shinohara, Tokyo (JP)

(73) Assignee: TDK CORPORATION, Tokyo (JP)

( * ) Notice: Subject to any disclaimer, the term of this patent is extended or adjusted under 35 U.S.C. 154(b) by 517 days.

(21) Appl. No.: 17/290,118

(22) PCT Filed: Nov. 6, 2018

(86) PCT No.: PCT/JP2018/041162
§ 371 (c)(1),
(2) Date: Apr. 29, 2021

(87) PCT Pub. No.: WO2020/095360
PCT Pub. Date: May 14, 2020

(65) Prior Publication Data
US 2021/0398726 A1  Dec. 23, 2021

(51) Int. Cl.
*H01F 10/32* (2006.01)
*H10N 50/80* (2023.01)
(Continued)

(52) U.S. Cl.
CPC ....... *H01F 10/3272* (2013.01); *H01F 10/329* (2013.01); *H01F 10/3286* (2013.01);
(Continued)

(58) Field of Classification Search
CPC ............. H01F 10/3272; H01F 10/3286; H01F 10/329; H01F 10/3254; H10N 50/80;
(Continued)

(56) References Cited

U.S. PATENT DOCUMENTS

2008/0180991 A1* 7/2008 Wang ................. G11C 11/5607
365/171
2011/0129691 A1  6/2011 Ishiwata et al.
(Continued)

FOREIGN PATENT DOCUMENTS

WO  2009/101827 A1  8/2009

OTHER PUBLICATIONS

Bang et al., "Enhancement of spin Hall effect induced torques for current-driven magnetic domain wall motion: Inner interface effect," Physical Review B, 2016, vol. 93, pp. 174424-1-174424-7.
(Continued)

*Primary Examiner* — Ahmed N Sefer
(74) *Attorney, Agent, or Firm* — Oliff PLC

(57) ABSTRACT

A domain wall moving type magnetic recording element includes: a domain wall moving layer in which first layers containing a rare earth metal and second layers containing a transition metal are alternately stacked in a first direction; and a first electrode and a second electrode which face the domain wall moving layer and are arranged to be away from each other. The domain wall moving layer has SOT suppression parts which are positioned in one of interfaces between the first layers and the second layers and contain a non-magnetic metal. The SOT suppression parts are locally distributed at the interface.

14 Claims, 7 Drawing Sheets

(51) Int. Cl.
    *H10N 50/10* (2023.01)
    *H01L 29/82* (2006.01)
    *H10B 99/00* (2023.01)
    *H10N 50/85* (2023.01)
    *H01L 27/105* (2023.01)
    *H10B 61/00* (2023.01)

(52) U.S. Cl.
    CPC ............ *H01L 27/105* (2013.01); *H01L 29/82* (2013.01); *H10B 99/00* (2023.02); *H10N 50/10* (2023.02); *H10N 50/80* (2023.02); *H10N 50/85* (2023.02); *H01F 10/3254* (2013.01); *H10B 61/00* (2023.02)

(58) Field of Classification Search
    CPC ........ H10N 50/10; H10N 50/85; H10B 61/00; H10B 99/00; G11C 11/161; G11C 11/1675; H01L 27/105; H01L 29/82
    See application file for complete search history.

(56) References Cited

U.S. PATENT DOCUMENTS

| | | | |
|---|---|---|---|
| 2015/0207063 A1* | 7/2015 | Tanigawa | H10N 50/10 257/421 |
| 2016/0276404 A1* | 9/2016 | Nakamura | H10N 50/85 |
| 2018/0123028 A1* | 5/2018 | Shiokawa | H10N 50/85 |
| 2018/0301199 A1* | 10/2018 | Sasaki | H10B 61/20 |
| 2019/0057732 A1* | 2/2019 | Shiokawa | G11C 11/165 |
| 2019/0267510 A1* | 8/2019 | Chen | H01L 33/06 |

OTHER PUBLICATIONS

Jan. 29, 2019 International Search Report issued in International Patent Application No. PCT/JP2018/041162.

* cited by examiner

DOMAIN WALL MOVING ELEMENT, DOMAIN WALL MOVING TYPE MAGNETIC RECORDING ELEMENT AND MAGNETIC RECORDING ARRAY

TECHNICAL FIELD

The present invention relates to a domain wall moving element, a domain wall moving type magnetic recording element, and a magnetic recording array.

BACKGROUND ART

As next-generation non-volatile memories that will replace flash memories or the like for which the limit of miniaturization has been reached, attention has been focused on resistance-changing type magnetic recording apparatuses in which data is stored using resistance-changing elements. For example, magnetoresistive random access memories (MRAMs), resistance random access memories (ReRAMs), phase change random access memories (PCRAMs), and the like are known as an example of a magnetic recording device.

In MRAMs, a change in resistance value caused due to a direction of magnetization is used for data recording. In order to increase the capacity of recording memories, the miniaturization of each of elements constituting a memory and multi-valued recording bits per element constituting the memory are being researched.

Patent Document 1 describes a domain wall moving type magnetic recording element in which multi-valued data can be recorded by moving a domain wall in a magnetic recording layer.

CITATION LIST

Patent Document

[Patent Document 1]
PCT International Publication No. WO 2009/101827

SUMMARY OF INVENTION

Technical Problem

A domain wall moving type magnetic recording element is required to have low electric power consumption. A domain wall moving type magnetic recording element records data by controlling a position of a domain wall. One method for reducing electric power consumption of a domain wall moving type magnetic recording element is to reduce the energy required to move a domain wall. There is a demand for a domain wall moving type magnetic recording element in which a domain wall can be efficiently moved.

The present invention was made in view of the above problems, and an object of the present invention is to provide a domain wall moving element, a domain wall moving type magnetic recording element, and a magnetic recording array having low electric power consumption.

Solution to Problem (1) A domain wall moving element according to a first aspect includes: a domain wall moving layer in which first layers containing a rare earth metal and second layers containing a transition metal are alternately stacked in a first direction; and a first electrode and a second electrode which face the domain wall moving layer and are arranged to be away from each other, wherein the domain wall moving layer has SOT suppression parts which are positioned in one of interfaces between the first layers and the second layers and contain a non-magnetic metal, and the SOT suppression parts are locally distributed at the interface.

(2) In the domain wall moving element according to the aspect, each of the SOT suppression parts may contain a non-magnetic transition metal with an atomic number of 48 or less.

(3) In the domain wall moving element according to the aspect, the SOT suppression parts may be discontinuously distributed at the interface.

(4) In the domain wall moving element according to the aspect, the SOT suppression parts may be dot-scattered in an island shape at the interface.

(5) In the domain wall moving element according to the aspect, each of the SOT suppression parts may protrude from the interface toward the first direction.

(6) In the domain wall moving element according to the aspect, the SOT suppression parts may be located above a stacked surface of each of the second layers.

(7) In the domain wall moving element according to the aspect, the SOT suppression parts may be located only above the stacked surface of each of the second layers.

(8) In a domain wall element according to the aspect, a total area of the SOT suppression parts at one interface may be 20% or more of an area of the interface.

(9) In the domain wall moving type magnetic recording element according to the aspect, each of the first layers may contain Tb, Gd or an alloy thereof.

(10) A domain wall moving type magnetic recording element according to a second aspect includes: the domain wall moving element according to the aspect; a first ferromagnetic layer which faces the domain wall moving layer and is located between the first electrode and the second electrode when viewed in a plan view from the first direction; and a non-magnetic layer located between the first ferromagnetic layer and the domain wall moving layer.

(11) In the domain wall moving type magnetic recording element according to the aspect, some of the SOT suppression parts may be located at a position that overlaps the first ferromagnetic layer when viewed in a plan view from the first direction.

(12) The domain wall moving type magnetic recording element according to the aspect may further include: a second ferromagnetic layer between the domain wall moving layer and the non-magnetic layer.

(13) The domain wall moving type magnetic recording element according to the aspect may further include: an underlayer on a surface of the domain wall moving layer opposite to a first surface facing the first ferromagnetic layer, wherein the underlayer may be a single layer formed of Ru, Ti, Cu, $SiO_2$, MgO, or SiN or a stacked body thereof.

(14) A magnetic recording array according to a third aspect includes: a plurality of the domain wall moving type magnetic recording elements according to the aspect.

Advantageous Effects of Invention

The domain wall moving element, the domain wall moving type magnetic recording element, and the magnetic recording array according to the above aspect operate with low electric power consumption.

DESCRIPTION OF EMBODIMENTS

Figure 1:
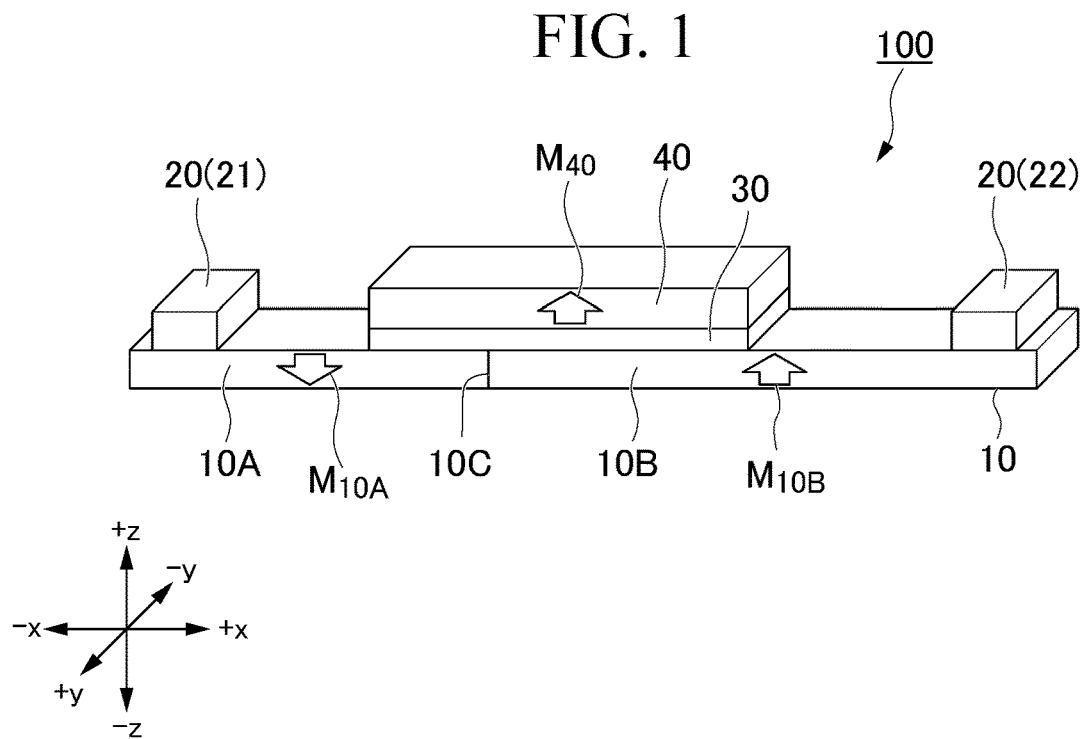
FIG. 1 is a perspective view of a domain wall moving type magnetic recording element according to a first embodiment.

This embodiment will be described in detail below with reference to the drawings as appropriate. In the drawings used in the following description, enlarged characteristic parts may be illustrated for convenience for the sake of easily understanding the features of the present invention in some cases. In addition, dimensional ratios or the like of each constituent element may be different from the actual ones in some cases. The materials, the dimensions, and the like exemplified in the following description are examples and the present invention is not limited thereto and can be appropriately modified and carried out within the range in which the effects of the present invention are exhibited.

Directions will be defined. A +z direction is a direction in which stacking is performed with respect to a support (not shown) configured to support a domain wall moving layer 10 which will be described later. A −z direction is a direction opposite to the +z direction. When the +z direction and the −z direction are not distinguished, they are simply referred to as a "z direction". A +x direction is a direction which is substantially orthogonal to the z direction and directed from a first electrode 21 toward a second electrode 22 which will be described later. A −x direction is a direction opposite to the +x direction. When the +x direction and the −x direction are not distinguished, they are simply referred to as an "x direction". A +y direction is one direction which is orthogonal to the z direction and the x direction. A −y direction is a direction opposite to the +y direction. When the +y direction and the −y direction are not distinguished, they are simply referred to as a "y direction". A first direction is an example of the +z direction.

(Domain Wall Moving Type Magnetic Recording Element)

First Embodiment

FIG. 1 is a perspective view schematically illustrating a domain wall moving type magnetic recording element 100 according to a first embodiment. The domain wall moving type magnetic recording element 100 includes the domain wall moving layer 10, two electrodes 20, a non-magnetic layer 30, and a first ferromagnetic layer 40. One of the two electrodes 20 is the first electrode 21 and the other is the second electrode 22. The domain wall moving layer 10 has a first magnetic domain 10A and a second magnetic domain 10B and has a domain wall 10C at a boundary between these.

The domain wall moving type magnetic recording element 100 records multi-valued data in accordance with a position of the domain wall 10C of the domain wall moving layer 10. The domain wall moving type magnetic recording element 100 records data as a resistance value in a direction in which the first ferromagnetic layer 40, the non-magnetic layer 30, and the domain wall moving layer 10 are stacked. The resistance value of the domain wall moving type magnetic recording element 100 changes depending on the states of magnetizations $M_{10A}$ and $M_{10B}$ of the domain wall moving layer 10 at a position where it overlaps with the first ferromagnetic layer 40 when viewed from the z direction.

A direction of the magnetization $M_{10A}$ of the first magnetic domain 10A is opposite (antiparallel) to a direction of a magnetization $M_{40}$ of the first ferromagnetic layer 40. A direction of the magnetization $M_{10B}$ of the second magnetic domain 10B is the same as (parallel to) the direction of the magnetization $M_{40}$ of the first ferromagnetic layer 40. In the case when an area of the first magnetic domain 10A in a portion in which the first magnetic domain 10A and the first ferromagnetic layer 40 overlap when viewed from the z direction increases, the resistance value of the domain wall moving type magnetic recording element 100 increases. In the case when an area of the second magnetic domain 10B in a portion in which the second magnetic domain 10B and the first ferromagnetic layer 40 overlap when viewed from the z direction increases, the resistance value of the domain wall moving type magnetic recording element 100 decreases. That is to say, the resistance value of the domain wall moving type magnetic recording element 100 increases when the domain wall 10C moves in the +x direction and decreases when the domain wall 10C moves in the −x direction.

When data is written to the domain wall moving type magnetic recording element 100, for example, a write current flows between the first electrode 21 and the second electrode 22. For example, if a current pulse in a prescribed direction is applied to the domain wall moving layer 10, the first magnetic domain 10A extends to the second magnetic domain 10B and the domain wall 10C moves toward the second electrode 22. The resistance value of the domain wall moving type magnetic recording element 100 is determined depending on a position of the domain wall 10C and data is written. The position of the domain wall 10C can be controlled in accordance with a current direction (the +x direction or the −x direction), a density, and the like of a current flowing through the domain wall moving layer 10.

Furthermore, the position of the domain wall 10C can also be controlled by applying an external magnetic field to the domain wall moving layer 10.

When data is read out from the domain wall moving type magnetic recording element 100, a read-out current flows between the first ferromagnetic layer 40 and the first electrode 21 or the second electrode 22. A read-out current is smaller than a write current and the domain wall 10C does not move. The resistance value of the domain wall moving type magnetic recording element 100 is obtained from the Ohm's law by applying a read-out current to the domain wall moving layer 10 and the first ferromagnetic layer 40 in the z direction. The resistance value of the domain wall moving type magnetic recording element 100 is converted into data.

<Domain Wall Moving Layer>

Figure 2:
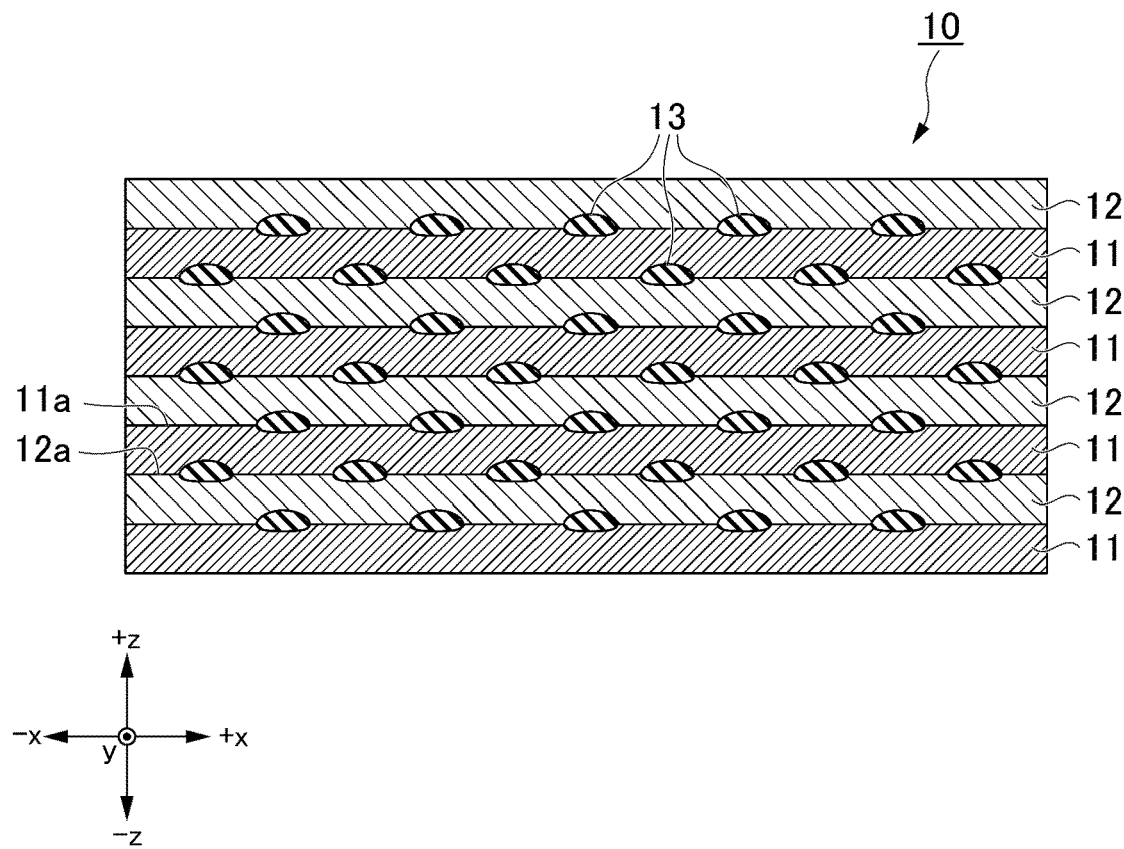
FIG. 2 is an enlarged cross-sectional view of a domain wall moving layer in the domain wall moving type magnetic recording element according to the first embodiment.

FIG. 2 is an enlarged cross-sectional view of the domain wall moving layer 10 in the domain wall moving type magnetic recording element according to the first embodiment. The domain wall moving layer 10 includes first layers 11, second layers 12, and spin-orbit torque (SOT) suppression parts 13.

The first layers 11 and the second layers 12 are alternately stacked in the z direction. A lowermost layer (a layer located in the most −z direction) of the domain wall moving layer 10 in FIG. 2 is one of the first layers 11, but may be one of the second layers 12. First surfaces 11a and 12a are surfaces on which the first layers 11 and the second layers 12 are stacked.

Each of the first layers 11 contains a rare earth metal. The first layer 11 contains, for example, Tb, Gd, or an alloy thereof. A thickness of the first layer 11 is, for example, 0.1 to 3 nm.

Each of the second layers 12 contains a transition metal. The second layer 12 contains, for example, Co, Fe, or CoFeB. A thickness of the second layer 12 is, for example, 0.1 to 3 nm.

A combination of the first layer 11 and the second layer 12 contains, for example, Gd—Co-based materials or Tb—Co-based materials. Ferrimagnetic substances such as Gd—Co-based materials and Tb—Co-based materials have a small saturation magnetization and a small threshold value current required for moving a domain wall.

Each of the SOT suppression parts 13 is located at an interface between the first layer 11 and the second layer 12. The SOT suppression part 13 contains a non-magnetic metal. The SOT suppression part 13 contains, for example, a non-magnetic transition metal with an atomic number of 48 or less.

The SOT suppression parts 13 are locally distributed at the interfaces between the first layers 11 and the second layers 12. The expression "locally distributed" means that they do not exist uniformly at the interfaces between the first layers 11 and the second layers 12.

Figure 3:
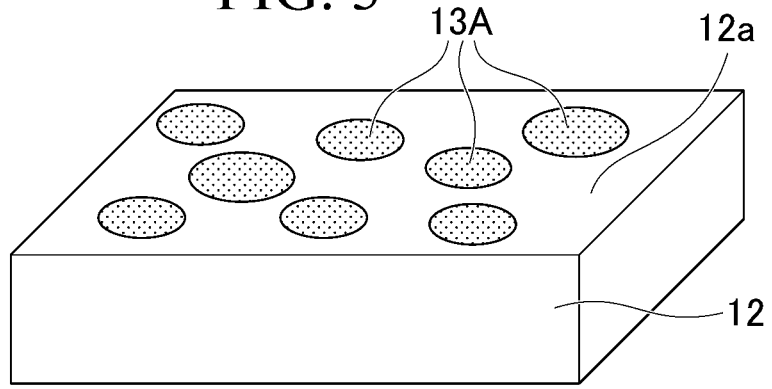
FIG. 3 is a perspective view schematically illustrating a distribution of spin-orbit torque (SOT) suppression parts.
Figure 4:
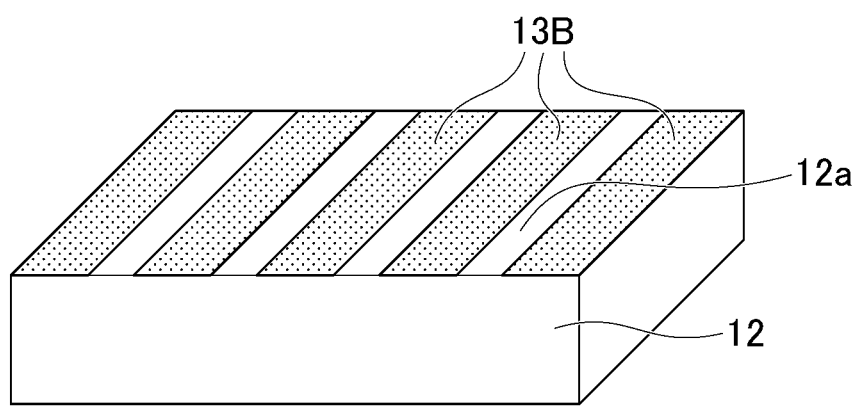
FIG. 4 is a perspective view schematically illustrating another example of the distribution of the SOT suppression parts.
Figure 5:
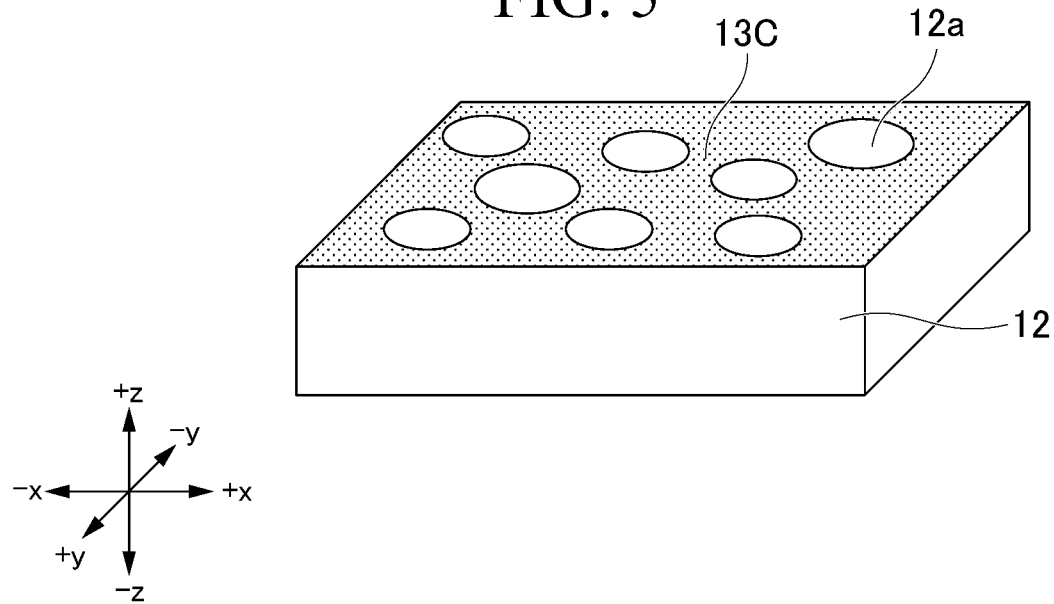
FIG. 5 is a perspective view schematically illustrating still another example of the distribution of the SOT suppression parts.

FIGS. 3 to 5 are perspective views schematically illustrating distributions of the SOT suppression parts 13A to 13C. FIGS. 3 to 5 are diagrams illustrating examples of the distributions of the SOT suppression parts 13A to 13C on the first surface 12a of the second layer 12. The SOT suppression parts 13A to 13C in FIGS. 3 to 5 are not uniform layers and none of them uniformly exist at the interfaces between the first layers 11 and the second layers 12.

The SOT suppression parts 13A illustrated in FIG. 3 are dot-scattered on the first surface 12a of the second layer 12 in an island shape. A plurality of SOT suppression parts 13A are discontinuously distributed.

The SOT suppression parts 13B illustrated in FIG. 4 are distributed on the first surface 12a of the second layer 12 in a strip shape. A plurality of SOT suppression parts 13B are discontinuously distributed. Each of the SOT suppression parts 13B extends in a direction (for example, the y direction) intersecting the x direction.

The SOT suppression part 13C illustrated in FIG. 5 has opening portions through which the first surface 12a of the second layer 12 is exposed and is continuously distributed.

The SOT suppression parts 13A illustrated in FIG. 3 is formed through agglomeration of atoms if sputtering is performed under the conditions in which a layer is not formed. The conditions in which a layer is not formed are, for example, the conditions in which a film formation thickness is a thickness of one atom layer or less. The SOT suppression parts 13B and 13C illustrated in FIGS. 4 and 5 can be obtained by forming a film through a mask or the like.

Although the description has been provided using the first surface 12a of the second layer 12 as an example with reference to FIGS. 3 to 5, the same applies to the first surface 11a of the first layer 11. Furthermore, the distributions of the SOT suppression parts 13 on the first surfaces 11a and 12a of each of a plurality of the first layers 11 and second layers 12 do not need to be the same and may be different from each other.

Each of the SOT suppression parts 13 is formed through sputtering or the like as described above. The SOT suppression part 13, for example, protrudes in the +z direction from an interface (the first surface 11a or 12a) between the first layers 11 and the second layers 12. In accordance with an implantation strength at the time of sputtering, the SOT suppression part 13 may be recessed in the −z direction from the interface (the first surface 11a or 12a) between the first layer 11 and the second layer 12.

A total area at one interface of the SOT suppression part 13 is, for example, preferably 20% or more, and more preferably 30% or more of an area of the interface between the first layer 11 and the second layer 12. Furthermore, the total area at one interface of the SOT suppression part 13 is, for example, preferably 80% or less, and more preferably 70% or less of the area of the interface between the first layer 11 and the second layer 12. The total area is a total area occupied by the SOT suppression parts 13 at one interface when viewed in a plan view from the z direction.

The SOT suppression part 13 prevents mixing in of rare earth metals included in the first layer 11 and transition metals included in the second layer 12. The first layer 11 and the second layer 12 are stacked through, for example, sputtering. For example, if elements constituting the second layer 12 are implanted into the first surface 11a of the first layer 11, a material of the second layer 12 may be mixed with the first layer 11 in some cases.

A portion in which the mixing occurs causes scattering of electrons moving in the x direction in the domain wall moving layer 10. Scattering of electrons is one of the causes of the spin Hall effect. The spin Hall effect is a phenomenon in which a spin current is induced in a direction orthogonal to a direction of a current on the basis of the spin-orbit interaction when the current flows. The spin Hall effect produces a spin-orbit torque (SOT) and applies the SOT to the magnetizations $M_{10A}$ and $M_{10B}$ in the domain wall moving layer 10.

Here, a spin transfer torque (STT) and an SOT acting on the inversion of the magnetizations $M_{10A}$ and $M_{10B}$ in the domain wall moving layer 10 will be described.

The STT applies a force to the magnetizations $M_{10A}$ and $M_{10B}$ in a 180° opposite direction. For example, in FIG. 1, a current flows from the second electrode 22 toward the first electrode 21. Since electrons flow in a direction opposite to that of a current, the electrons move from the first electrode 21 toward the second electrode 22. The electrons which pass through the first magnetic domain 10A are converted into spins oriented in the −z direction under the influence of the magnetization $M_{10A}$. The spins oriented in the −z direction are injected into the second magnetic domain 10B. The spins oriented in the −z direction injected into the second magnetic domain 10B apply a torque in a 180° opposite direction to the magnetization $M_{10B}$ oriented in the +z direction. The magnetization $M_{10B}$ fluctuates due to heat or the like. When the torque in a 180° opposite direction is applied at a timing at which the magnetization $M_{10B}$ is slightly tilted from the +z direction, the magnetization $M_{10B}$ reverses while making a precession moving. If a part of the magnetization $M_{10B}$ of the second magnetic domain 10B reverses, the domain wall 10C moves in the +x direction.

Figure 6:
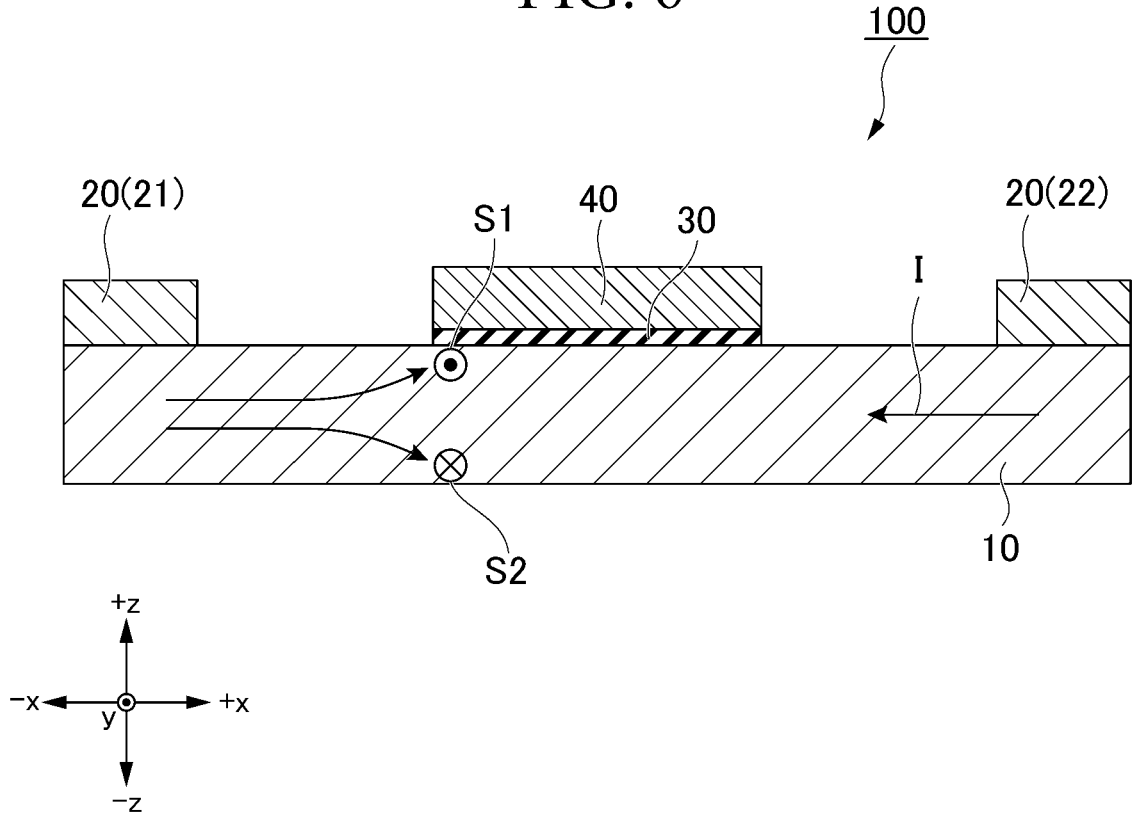
FIG. 6 is a cross-sectional view of the domain wall moving type magnetic recording element for explaining the SOT.

On the other hand, the SOT applies force to the magnetizations $M_{10A}$ and $M_{10B}$ in a direction tilted by 90°. FIG. 6 is a cross-sectional view of the domain wall moving type magnetic recording element 100 for explaining the SOT. For example, as illustrated in FIG. 6, a current I flows from the second electrode 22 toward the first electrode 21. When the spin Hall effect occurs, a first spin S1 oriented in one direction and a second spin S2 oriented in a direction opposite to that of the first spin S1 are bent in a direction orthogonal to the current. For example, the first spin S1 oriented in the +y direction is bent in the +z direction with respect to a traveling direction and the second spin S2 oriented in the −y direction is bent in the −z direction with respect to a traveling direction.

Basically, the spin Hall effect does not easily occur in a magnetic substance. However, if a portion in which magnetic substances are mixed exists in the domain wall moving layer 10, electrons are scattered in that portion and the spin Hall effect occurs. The first spin S1 oriented in the +y direction and the second spin S2 oriented in the −y direction apply the SOT acting on the magnetization $M_{10B}$ (refer to FIG. 1) oriented in the +z direction in a direction tilted by 90°. The magnetization $M_{10B}$ first quickly collapses to 90° and then reverses. Due to a direction in which a torque acts, the magnetization reversal due to an SOT occurs more quickly than the magnetization reversal due to an STT.

If the STT and the SOT act on the magnetizations $M_{10A}$ and $M_{10B}$ of the domain wall moving layer 10 at the same time, since vector directions in which the STT and the SOT act are different, the SOT disturbs the precession moving of the magnetizations $M_{10A}$ and $M_{10B}$ due to the STT. That is to say, the SOT causes disturbance of the reversal of the magnetizations $M_{10A}$ and $M_{10B}$ due to the STT. In other words, if the production of the SOT can be suppressed, the domain wall 10C of the domain wall moving layer 10 efficiently moves.

Each of the SOT suppression parts 13 is located at the interface between the first layer 11 and the second layer 12. The SOT suppression part 13 prevents mixing between the first layer 11 and the second layer 12 and suppresses the production of the SOT. The SOT suppression part 13 is made of a non-magnetic transition metal. In addition, even if mixing between the first layer 11 and the second layer 12 occurs, the spin Hall effect does not occur. Furthermore, the atoms constituting the SOT suppression part 13 are lighter than the atoms constituting the first layers 11 and the second layers 12. The atoms constituting the SOT suppression part 13 are not easily implanted into the first layers 11 and the second layers 12 and mixing itself hardly occurs.

Also, the SOT suppression part 13 does not form a layer, is locally distributed, and does not significantly hinder a magnetic correlation between the first layer 11 and the second layer 12. When the magnetic correlation between the first layers 11 and the second layers 12 is maintained, the orientation of the magnetizations $M_{10A}$ and $M_{10B}$ of the domain wall moving layer 10 is improved and data can be stably maintained.

<First Ferromagnetic Layer>

The first ferromagnetic layer 40 is located between the first electrode 21 and the second electrode 22 when viewed in a plan view from the z direction (refer to FIG. 1). The first ferromagnetic layer 40 has, for example, a major axis in the x direction.

The first ferromagnetic layer 40 contains a ferromagnetic substance. Examples of a ferromagnetic material forming the first ferromagnetic layer 40 include metals selected from the group consisting of Cr, Mn, Co, Fe, and Ni, alloys containing one or more of these metals, alloys containing these metals and at least one or more elements of B, C, and N, and the like. To be specific, Co—Fe, Co—Fe—B, and Ni—Fe may be exemplified.

Also, a material forming the first ferromagnetic layer 40 may be a Heusler alloy. The Heusler alloy is a half metal and has a high spin polarizability. The Heusler alloy contains an intermetallic compound having a chemical composition of XYZ or $X_2YZ$, where X represents a Co-, Fe-, Ni-, or Cu-group transition metal element or noble metal element in the periodic table, Y represents a Mn-, V-, Cr-, or Ti-group transition metal or an element of the X type in the periodic table, and Z represents a typical element from Group III to Group V. Examples of the Heusler alloy include $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like.

A film thickness of the first ferromagnetic layer 40 is preferably 1.5 nm or less, and more preferably 1.0 nm or less in the case of an easy axis of magnetization of the first ferromagnetic layer 40 is set to the z direction (set to a perpendicular magnetization film). If the film thickness of the first ferromagnetic layer 40 is reduced, a perpendicular magnetic anisotropy (an interface perpendicular magnetic anisotropy) can be added to the first ferromagnetic layer 40 at an interface between the first ferromagnetic layer 40 and another layer (the non-magnetic layer 30). That is to say, a direction of magnetization of the first ferromagnetic layer 40 can be set to the z direction.

<Non-Magnetic Layer>

A known material can be used for the non-magnetic layer 30.

For example, when the non-magnetic layer 30 is made of an insulator (when the non-magnetic layer 30 is a tunnel barrier layer), $Al_2O_3$, $SiO_2$, MgO, $MgAl_2O_4$, and the like can be used as a material thereof. Furthermore, in addition to these, materials and the like in which a part of Al, Si, and Mg is replaced with Zn, Be, or the like can also be used. Among these, since MgO and $MgAl_2O_4$ are materials in which a coherent tunnel can be realized, spins can be efficiently injected. When the non-magnetic layer 30 is made of a metal, Cu, Au, Ag, and the like can be used as a material thereof. In addition, when the non-magnetic layer 30 is made of a semiconductor, Si, Ge, $CuInSe_2$, $CuGaSe_2$, $Cu(In,Ga)Se_2$, and the like can be used as a material thereof.

<First Electrode and Second Electrode>

The first electrode 21 and the second electrode 22 face the domain wall moving layer 10. Another layer may be provided between the first electrode 21 and the second electrode 22, and the domain wall moving layer 10. The first electrode 21 and the second electrode 22 may face any surface of the domain wall moving layer 10. The first electrode 21 and the second electrode 22 are arranged apart from each other.

The first electrode 21 and the second electrode 22 are made of, for example, a magnetic substance. An orientation direction of magnetization of the first electrode 21 is the same direction as that of the first magnetic domain 10A (for example, the −z direction) and an orientation direction of magnetization of the second electrode 22 is the same direction as that of the second magnetic domain 10B (for example, the +z direction). Since the magnetizations of the first electrode 21 and the second electrode 22 are fixed in a prescribed direction, a moving range of the domain wall 10C is limited. For example, In the case of the magnetization of the first electrode 21 is oriented in the −z direction, the magnetization of the first magnetic domain 10A immediately below the first electrode 21 is fixed in the −z direction. A moving of the domain wall 10C in the −x direction is restricted from an end portion on the first ferromagnetic layer 40 side of the first electrode 21.

When the domain wall moving type magnetic recording element 100 according to the first embodiment includes the SOT suppression parts 13, the production of the SOT in the domain wall moving layer 10 is suppressed. The SOT hinders magnetization reversal due to the STT, which cause the moving of the domain wall 10C to be disturbed. The domain wall moving type magnetic recording element 100 according to the first embodiment can efficiently move the domain wall 10C and can be driven with low power consumption.

Although the example of the domain wall moving type magnetic recording element 100 according to the first embodiment has been described in detail above, the additions, omissions, substitutions, and other modifications are possible without departing from the gist of the present invention.

First Modified Example

Figure 7:
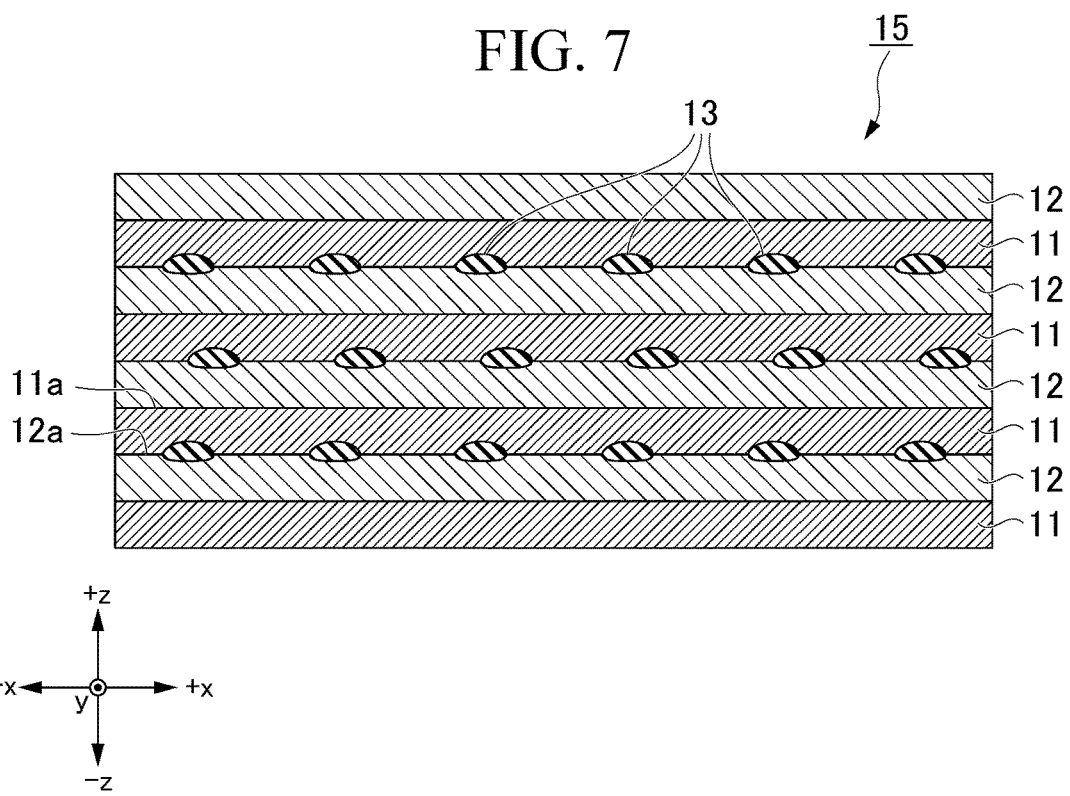
FIG. 7 is an enlarged cross-sectional view of a domain wall moving layer of a domain wall moving type magnetic recording element according to a first modified example.

FIG. 7 is an enlarged cross-sectional view of a domain wall moving layer 15 of a domain wall moving type magnetic recording element according to a first modified example. A constituent element in the first modified example that are the same as the domain wall moving layer 10 illustrated in FIG. 2 will be denoted by the same reference numeral and a description thereof will be omitted. The domain wall moving layer 15 includes first layers 11, second layers 12, and SOT suppression parts 13.

In the first modified example, each of the SOT suppression parts 13 exists only on a first surfaces 12a (a stacked surface) of each of the second layers 12. A rare earth metal constituting each of the first layers 11 is implanted into the first surface 12a of the second layer 12. The rare earth metal is heavier and larger than a transition metal constituting the second layer 12. Heavy and large atoms are easily implanted into another layer using sputtering and easily mixed. Furthermore, heavy and larger atoms cause scattering of electrons and cause the spin Hall effect to be remarkably exhibited. That is to say, the rare earth metal mixed in the second layer 12 causes a larger SOT due to the spin Hall effect than the transition metal mixed in the first layers 11. When the first surface 12a of the second layer 12 is protected using the SOT suppression part 13, it is possible to suppress the production of the SOT.

Second Modified Example

Figure 8:
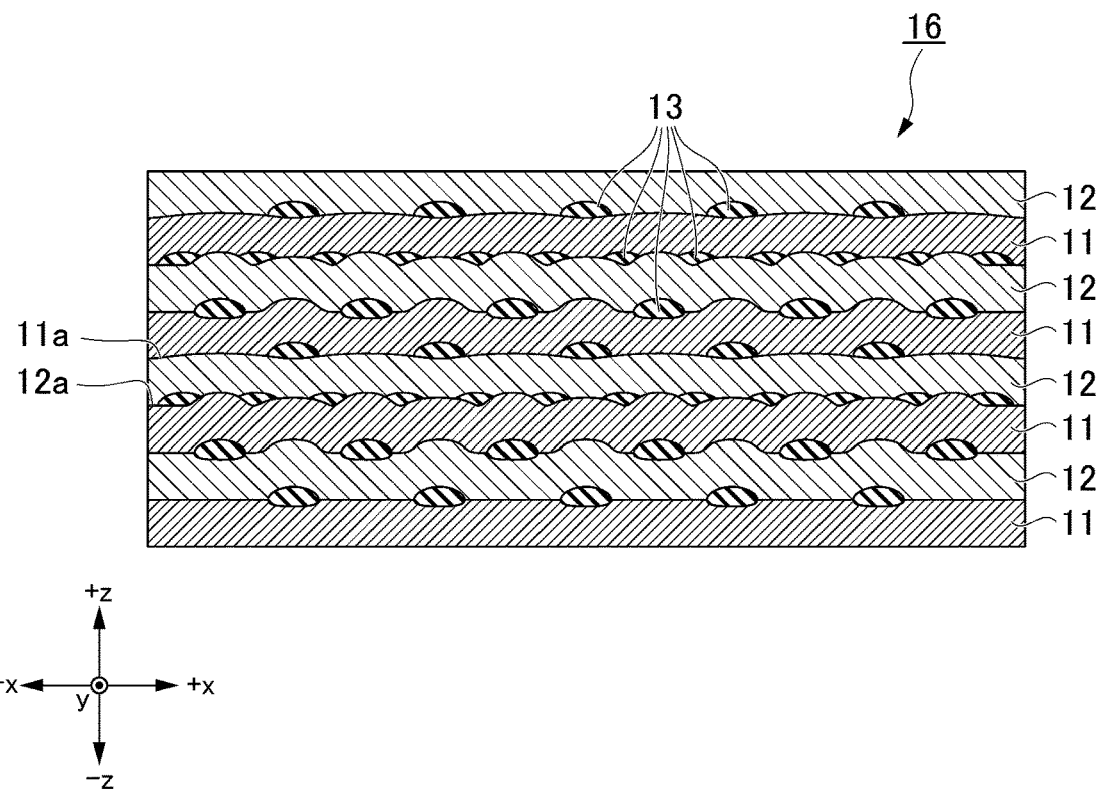
FIG. 8 is an enlarged cross-sectional view of a domain wall moving layer of a domain wall moving type magnetic recording element according to a second modified example.

FIG. 8 is an enlarged cross-sectional view of a domain wall moving layer 16 of a domain wall moving type magnetic recording element according to a second modified example. A constituent element in the second modified example that is the same as the domain wall moving layer 10 illustrated in FIG. 2 will be denoted by the same reference numeral and a description thereof will be omitted. The domain wall moving layer 16 includes first layers 11, second layers 12, and SOT suppression parts 13.

The first surfaces 11a and 12a of the first layers 11 and the second layers 12 illustrated in FIG. 8 have shapes of surfaces to be stacked reflected therein and have unevenness. The unevenness is formed in the stacked surface due to the SOT suppression parts 13 protruding from the first surfaces 11a and 12a. Here, the term "reflected" does not intended to only that the shapes of the stacked surfaces to be stacked are fully reflected in the first surfaces 11a and 12a. If a rate of change in a surface shape of a neighboring layer is within 10% with respect to the z direction and within 10% with respect to the xy directions, it can be said that the reflection is performed.

Third Modified Example

Figure 9:
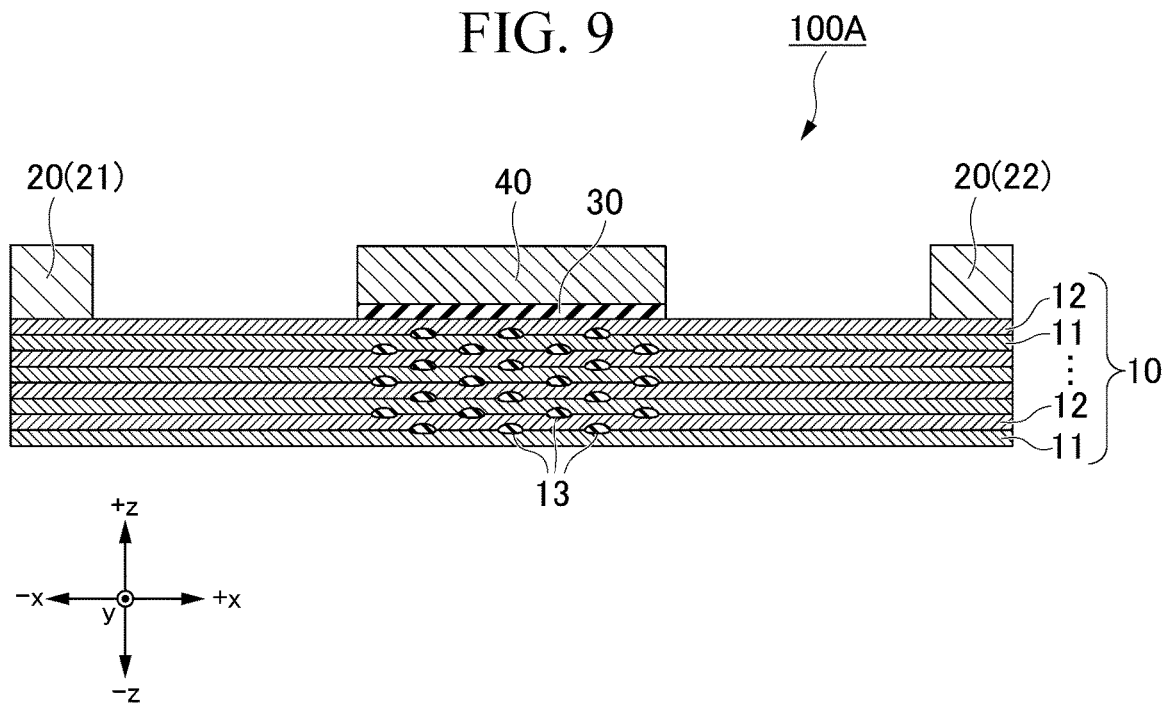
FIG. 9 is a cross-sectional view of a domain wall moving type magnetic recording element according to a third modified example.

FIG. 9 is a cross-sectional view of a domain wall moving type magnetic recording element 100A according to a third modified example. A constituent element in the third modified example that is the same as the domain wall moving type magnetic recording element 100 illustrated in FIG. 1 will be denoted by the same reference numeral and a description thereof will be omitted.

The domain wall moving type magnetic recording element 100A has some of the SOT suppression parts 13 at a position that overlaps the first ferromagnetic layer 40 when viewed in a plan view from the z direction. A resistance value of the domain wall moving type magnetic recording element 100A changes in accordance with a state of the magnetization of a domain wall moving layer 10 at a position in which the domain wall moving layer 10 and the first ferromagnetic layer 40 overlap when viewed in a plan view from the z direction. In other words, when a domain wall 10C (refer to FIG. 1) is located at a position in which the domain wall 10C and the first ferromagnetic layer 40 do not overlap when viewed in a plan view from the z direction, the resistance value of the domain wall moving type magnetic recording element 100A does not change. Therefore, a place in which the movement of the domain wall 10C needs to be controlled most is a portion in which the domain wall moving layer 10 and the first ferromagnetic layer 40 overlap when viewed in a plan view from the z direction in the domain wall moving layer 10. The domain wall moving type magnetic recording element 100A according to the third modified example includes the SOT suppression parts 13 in the portion and can sufficiently control the moving of the domain wall 10C.

Fourth Modified Example

Figure 10:
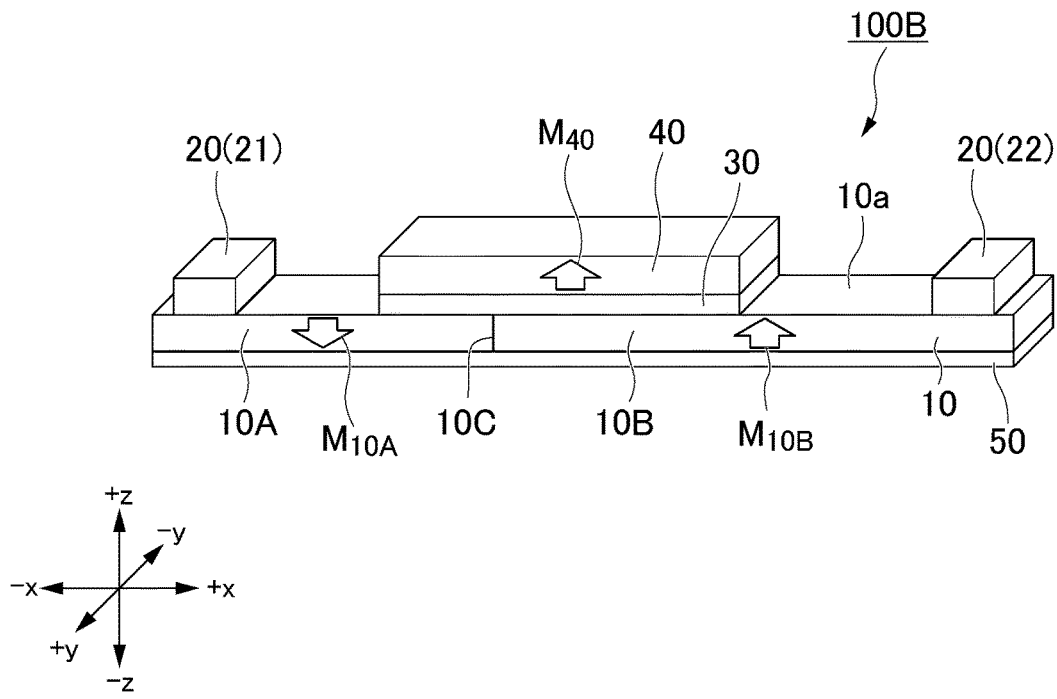
FIG. 10 is a perspective view of a domain wall moving type magnetic recording element according to a fourth modified example.

FIG. 10 is a cross-sectional view of a domain wall moving type magnetic recording element 100B according to a fourth modified example. A constituent element in the fourth modified example that is the same as the domain wall moving type magnetic recording element 100 illustrated in FIG. 1 will be denoted by the same reference numeral and a description thereof will be omitted.

The domain wall moving type magnetic recording element 100B includes an underlayer 50 on a surface of a domain wall moving layer 10 opposite to a first surface 10a facing a first ferromagnetic layer 40.

The underlayer 50 controls crystallinity such as a crystal orientation and a crystal grain size of each layer including a first ferromagnetic metal layer 1. The underlayer 50 enhances orientations the magnetizations $M_{10A}$ and $M_{10B}$ of the domain wall moving layer 10 and the magnetization $M_{40}$ of the first ferromagnetic layer 40 and increases a resistance change rate of the domain wall moving type magnetic recording element 100B.

The underlayer 50 is a single layer formed of Ru, Ti, Cu, $SiO_2$, MgO, or SiN or a stacked body thereof. If a current flows through the underlayer 50, the spin Hall effect occurs in the underlayer 50. Spins oriented in one direction (for example, in the +y direction) due to the spin Hall effect move in the +z direction and are injected into the domain wall moving layer 10 (refer to FIG. 6). The spins injected into the domain wall moving layer 10 causes the moving of the domain wall 10C to be hindered. When the above materials are used for the underlayer 50, a current does not substantially flow through the underlayer 50 or the spin Hall effect does not easily occur even if a current flows. That is to say, the underlayer 50 does not hinder the moving of the domain wall 10C.

Fifth Modified Example

Figure 11:
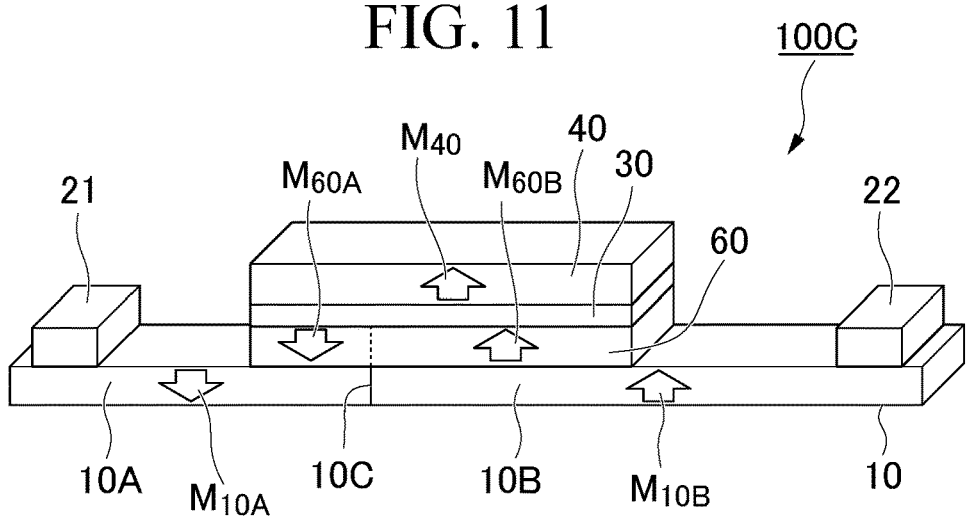
FIG. 11 is a perspective view of a domain wall moving type magnetic recording element according to a fifth modified example.
Figure 11:
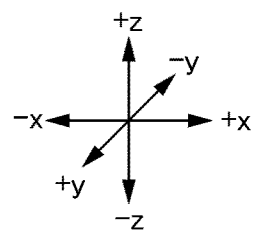

FIG. 11 is a perspective view of a domain wall moving type magnetic recording element 100C according to a fifth modified example. The domain wall moving type magnetic recording element 100C illustrated in FIG. 11 is different from the domain wall moving type magnetic recording element 100 illustrated in FIG. 1 in that, in the domain wall moving type magnetic recording element 100C, a second ferromagnetic layer 60 is provided between a domain wall moving layer 10 and a non-magnetic layer 30. The second ferromagnetic layer 60 has a magnetic state of the domain wall moving layer 10 reflected therein.

The second ferromagnetic layer 60 contains a magnetic substance. The same magnetic substance as that of the first ferromagnetic layer 40 can be used for the magnetic substance constituting the second ferromagnetic layer 60.

The second ferromagnetic layer 60 is adjacent to the domain wall moving layer 10. The magnetizations $M_{60A}$ and $M_{60B}$ of the second ferromagnetic layer 60 are magnetically coupled to the magnetization of the domain wall moving layer 10. The second ferromagnetic layer 60 has a magnetic state of the domain wall moving layer 10 reflected therein. When the second ferromagnetic layer 60 is ferromagnetically coupled to the domain wall moving layer 10, the magnetic state of the second ferromagnetic layer 60 is the same as the magnetic state of the domain wall moving layer 10. When the second ferromagnetic layer 60 is antiferromagnetically coupled to the domain wall moving layer 10, the magnetic state of the second ferromagnetic layer 60 is opposite to the magnetic state of the domain wall moving layer 10.

An MR ratio of the domain wall moving type magnetic recording element 100C is produced depending on a change in magnetic state of two magnetic substances (the first ferromagnetic layer 40 and the second ferromagnetic layer 60) having the non-magnetic layer 30 arranged therebetween. It is desirable that the second ferromagnetic layer 60 contain a material in which a coherent tunnel effect is easily obtained between the second ferromagnetic layer 60 and the first ferromagnetic layer 40.

On the other hand, it is desirable that the domain wall moving layer 10 contain a material in which a moving speed of the domain wall 10C is reduced. In this case of the domain wall moving type magnetic recording element 100 illustrated in FIG. 1, the domain wall moving layer 10 is one of the two magnetic substances having the non-magnetic layer 30 arranged therebetween. In the case of the domain wall moving type magnetic recording element 100 illustrated in FIG. 1, it is desirable that the domain wall moving layer 10 be constituted of a material in which the moving speed of the domain wall 10C is reduced and the MR ratio of the domain wall moving type magnetic recording element 100 can be improved. On the other hand, in the case of the domain wall moving type magnetic recording element 100C illustrated in FIG. 11, the domain wall moving layer 10 does not contain two magnetic substances having the non-magnetic layer 30 arranged therebetween. In the case of the domain wall moving type magnetic recording element 100C illustrated in FIG. 11, a material constituting the domain wall moving layer 10 has little influence on the MR ratio of the domain wall moving type magnetic recording element 100C. Therefore, the domain wall moving type magnetic recording element 100C illustrated in FIG. 11 has an increased degree of freedom when a material of the domain wall moving layer 10 is selected.

Second Embodiment

Figure 12:
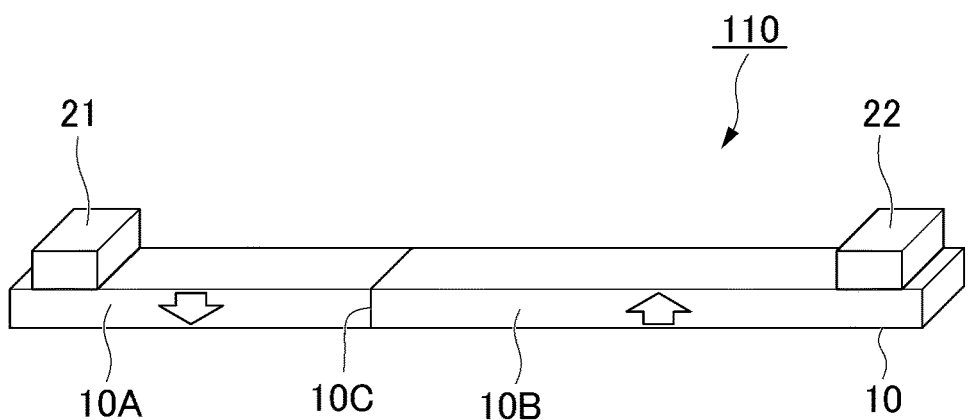
FIG. 12 is a perspective view of a domain wall moving element according to a second embodiment.
Figure 12:
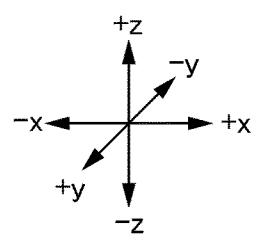

FIG. 12 is a perspective view of a domain wall moving element 110 according to a second embodiment. The domain wall moving element 110 illustrated in FIG. 12 is different from the domain wall moving type magnetic recording element 100 illustrated in FIG. 1 in that the domain wall moving element 110 does not include a non-magnetic layer 30 and the first ferromagnetic layer 40.

The domain wall moving element 110 according to the second embodiment can be applied to the domain wall moving type magnetic recording element described above. Moreover, the applications of the present invention are not limited and the present invention can be applied to other applications. As one of the other applications, for example, the domain wall moving element 110 can be arranged in each pixel and used in a spatial light modulator configured to spatially modulate incident light using a magneto-optical effect.

Third Embodiment

Figure 13:
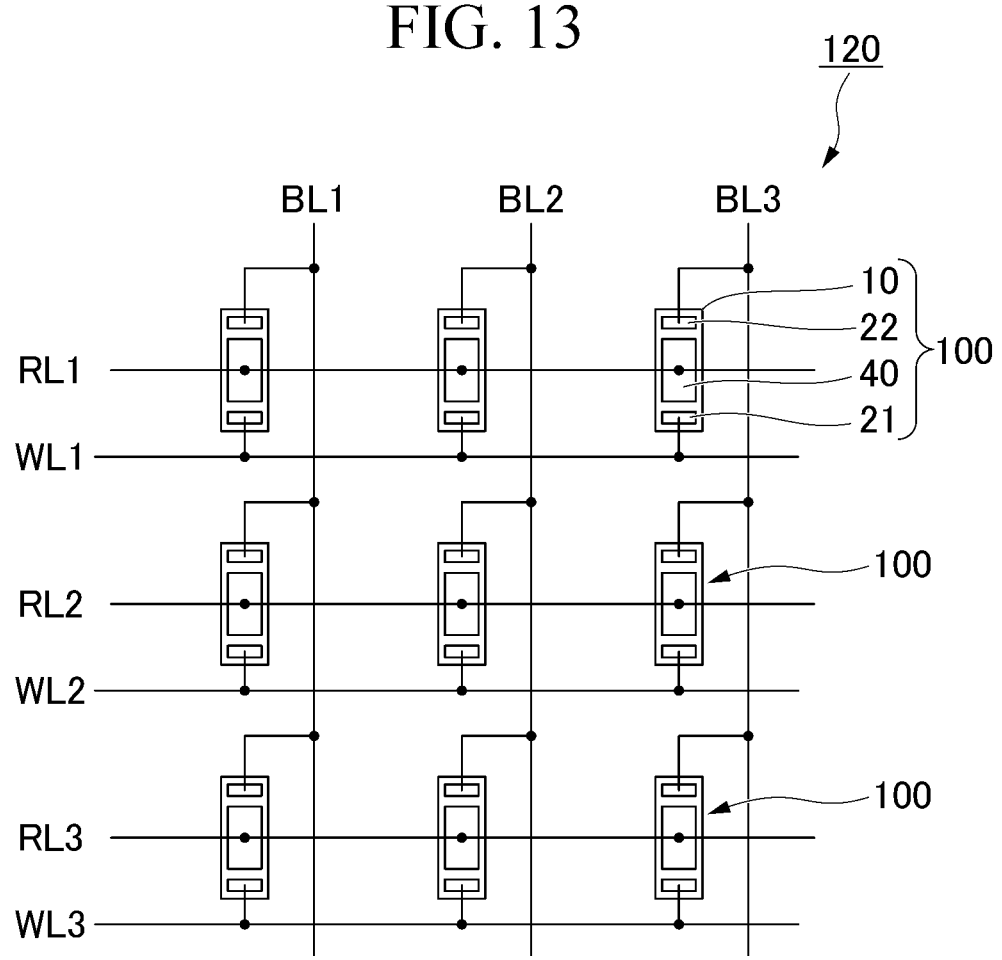
FIG. 13 is a circuit diagram of a magnetic recording array according to a third embodiment.

FIG. 13 is a plan view of a magnetic recording array 120 according to a third embodiment. The magnetic recording array 120 illustrated in FIG. 13 includes a plurality of the domain wall moving type magnetic recording elements 100 illustrated in FIG. 1 having a 3×3 matrix arrangement. FIG. 13 is an example of a magnetic recording array and a type of domain wall moving type magnetic recording element 100, the number of domain wall moving type magnetic recording elements 100, and the arrangement of the domain wall moving type magnetic recording elements 100 are arbitrary. Furthermore, instead of the domain wall moving type magnetic recording element 100 illustrated in FIG. 1, the domain wall moving type magnetic recording elements according to the modified examples may be used.

One of word lines WL1 to WL3, one of bit lines BL1 to BL3, and one of read lines RL1 to RL3 are connected to each of the domain wall moving type magnetic recording elements 100.

A writing operation is performed by selecting one of the word lines WL1 to WL3 and one of the bit lines BL1 to BL3 to which a current is applied and flowing a pulsed current through a domain wall moving layer 10 of any of the domain wall moving type magnetic recording elements 100. Furthermore, a reading operation is performed by selecting one of the read lines RL1 to RL3 and one of the bit lines BL1 to BL3 to which a current is applied and flowing a current in a direction in which any of the domain wall moving type magnetic recording elements 100 is stacked. One of the word lines WL1 to WL3, one of the bit lines BL1 to BL3, and one of the read lines RL1 to RL3 to which a current is applied can be selected using a transistor or the like. When data is recorded on the plurality of domain wall moving type magnetic recording elements 100, each of which can record multi-valued information, it is possible to increase the capacity of the magnetic recording array 120.

Also, the domain wall moving type magnetic recording elements 100 can record analog data instead of digital signals which are "1" and "0". For this reason, it is possible to utilize the magnetic recording array 120 for a neuromorphic device and the like in which the brain is imitated.

While the preferred embodiments of the present invention have been described in detail above, the present invention is not limited to a specific embodiment and various modifications and changes are possible without departing from the gist of the present invention described within the scope of the claims.

REFERENCE SIGNS LIST 10, 15, 16 Domain wall moving layer
10A First magnetic domain
10B Second magnetic domain
10C Domain wall
11 First layer
12 Second layer
10a, 11a, 12a First surface
13, 13A, 13B, 13C SOT suppression part
20 Electrode
21 First electrode
22 Second electrode
30 Non-magnetic layer
40 First ferromagnetic layer
50 Underlayer
60 Second ferromagnetic layer
100, 100A, 100B, 100C Domain wall moving type magnetic recording element
110 Domain wall moving element
120 Magnetic recording array
$M_{10A}$, $M_{10B}$, $M_{40}$, $M_{50A}$, $M_{50B}$ Magnetization
RL1, RL2, RL3 Read line
BL1, BL2, BL3 Bit line
WL1, WL2, WL3 Word line

What is claimed is:

1. A domain wall moving element, comprising:
a domain wall moving layer in which first layers containing a rare earth metal and second layers containing a transition metal are alternately stacked in a first direction; and
a first electrode and a second electrode which face the domain wall moving layer and are arranged to be away from each other,
wherein the domain wall moving layer has spin-orbit torque (SOT) suppression parts which are positioned in one of interfaces between the first layers and the second layers and contain a non-magnetic metal, and
the SOT suppression parts are locally distributed at the interface.

2. The domain wall moving element according to claim 1, wherein each of the SOT suppression parts contains a non-magnetic transition metal with an atomic number of 48 or less.

3. The domain wall moving element according to claim 1, wherein the SOT suppression parts are discontinuously distributed at the interface.

4. The domain wall moving element according to claim 3, wherein the SOT suppression parts are dot-scattered in an island shape at the interface.

5. The domain wall moving element according to claim 1, wherein each of the SOT suppression parts protrudes from the interface toward the first direction.

6. The domain wall moving element according to claim 1, wherein the SOT suppression parts are located above a stacked surface of each of the second layers.

7. The domain wall moving element according to claim 6, wherein the SOT suppression parts are located only above the stacked surface of each of the second layers.

8. The domain wall moving element according to claim 1, wherein a total area of the SOT suppression parts at one interface is 20% or more of an area of the interface.

9. The domain wall moving element according to claim 1, wherein each of the first layers contains Tb, Gd or an alloy thereof.

10. A domain wall moving type magnetic recording element, comprising:
the domain wall moving element according to claim 1;
a first ferromagnetic layer which faces the domain wall moving layer and is located between the first electrode and the second electrode when viewed in a plan view from the first direction; and
a non-magnetic layer located between the first ferromagnetic layer and the domain wall moving layer.

11. The domain wall moving type magnetic recording element according to claim 10, wherein some of the SOT suppression parts is located at a position that overlaps the first ferromagnetic layer when viewed in a plan view from the first direction.

12. The domain wall moving type magnetic recording element according to claim 10, further comprising:
a second ferromagnetic layer between the domain wall moving layer and non-magnetic layer.

13. The domain wall moving type magnetic recording element according to claim 10, further comprising:
an underlayer on a surface of the domain wall moving layer opposite to a first surface facing the first ferromagnetic layer,
wherein the underlayer is a single layer formed of Ru, Ti, Cu, $SiO_2$, MgO, or SiN or a stacked body thereof.

14. A magnetic recording array, comprising:
a plurality of the domain wall moving type magnetic recording elements according to claim 10.

* * * * *